(12) United States Patent
Shin et al.

(10) Patent No.: US 11,923,216 B2
(45) Date of Patent: Mar. 5, 2024

(54) APPARATUS AND METHOD FOR TREATING SUBSTRATE INCLUDING PROCESS CHAMBERS AND TRANSFER CHAMBER

(71) Applicant: SAMSUNG ELECTRONICS CO., LTD., Suwon-si (KR)

(72) Inventors: Seung Min Shin, Suwon-si (KR); Sang Jin Park, Suwon-si (KR); Hae Won Choi, Daejeon (KR); Jang Jin Lee, Seoul (KR); Ji Hwan Park, Hwaseong-si (KR); Kun Tack Lee, Suwon-si (KR); Koriakin Anton, Cheonan-si (KR); Joon Ho Won, Suwon-si (KR); Jin Yeong Sung, Goesan-gun (KR); Pil Kyun Heo, Yongin-si (KR)

(73) Assignees: SAMSUNG ELECTRONICS CO., LTD., Suwon-si (KR); SEMES CO., LTD., Cheonan-si (KR)

(*) Notice: Subject to any disclaimer, the term of this patent is extended or adjusted under 35 U.S.C. 154(b) by 0 days.

(21) Appl. No.: 17/892,677

(22) Filed: Aug. 22, 2022

(65) Prior Publication Data

US 2023/0197481 A1 Jun. 22, 2023

(30) Foreign Application Priority Data

Dec. 17, 2021 (KR) .................. 10-2021-0181340

(51) Int. Cl.
*H01L 21/67* (2006.01)
*G03F 7/16* (2006.01)
*H01L 21/677* (2006.01)

(52) U.S. Cl.
CPC ........ *H01L 21/67196* (2013.01); *G03F 7/168* (2013.01); *H01L 21/67017* (2013.01);
(Continued)

(58) Field of Classification Search
None
See application file for complete search history.

(56) References Cited

U.S. PATENT DOCUMENTS

| 5,944,894 A | * | 8/1999 | Kitano | H01L 21/67178 |
| | | | | 118/300 |
| 6,379,056 B1 | * | 4/2002 | Ueda | H01L 21/67178 |
| | | | | 118/52 |

(Continued)

FOREIGN PATENT DOCUMENTS

| KR | 10-0386130 B1 | 8/2003 |
| KR | 10-2006-0090589 A | 8/2006 |

(Continued)

OTHER PUBLICATIONS

Communication dated Sep. 15, 2023 by the Korean Intellectual Property Office for Korean Patent Application No. 10-2021-0181340.

*Primary Examiner* — Binu Thomas
(74) *Attorney, Agent, or Firm* — Sughrue Mion, PLLC

(57) ABSTRACT

An apparatus and method for treating a substrate are provided. The apparatus includes at least one first process chamber configured to supply a developer onto the substrate; at least one second process chamber configured to treat the substrate using a supercritical fluid; a transfer chamber configured to transfer the substrate from the at least one first process chamber to the at least one second process chamber, while the developer supplied in the at least one first process chamber remains on the substrate; and a temperature and humidity control system configured to manage temperature and humidity of the transfer chamber by supplying a first gas of constant temperature and humidity into the transfer chamber.

19 Claims, 15 Drawing Sheets

(52) U.S. Cl.
CPC .. *H01L 21/67173* (2013.01); *H01L 21/67178* (2013.01); *H01L 21/6719* (2013.01); *H01L 21/67225* (2013.01); *H01L 21/67748* (2013.01)

(56) References Cited

U.S. PATENT DOCUMENTS

| | | | |
|---|---|---|---|
| 6,473,151 B1* | 10/2002 | Deguchi | H01L 21/67178 |
| | | | 118/719 |
| 6,875,281 B2* | 4/2005 | Kitano | H01L 21/67253 |
| | | | 118/665 |
| 7,060,422 B2 | 6/2006 | Biberger et al. | |
| 9,214,331 B2 | 12/2015 | Miya et al. | |
| 9,691,638 B2 | 6/2017 | Choi et al. | |
| 10,908,503 B2 | 2/2021 | Choi et al. | |
| 10,950,465 B2 | 3/2021 | Kitayama et al. | |
| 10,998,186 B2 | 5/2021 | Goshi et al. | |
| 2006/0177586 A1* | 8/2006 | Ishida | H01L 21/67178 |
| | | | 118/500 |
| 2017/0136489 A1* | 5/2017 | Maeda | H01L 21/67178 |
| 2019/0252223 A1* | 8/2019 | Minamida | H01L 21/67178 |
| 2019/0295863 A1* | 9/2019 | Inagaki | H01L 21/67178 |
| 2020/0219736 A1* | 7/2020 | Aoki | H01L 21/67178 |

FOREIGN PATENT DOCUMENTS

| | | |
|---|---|---|
| KR | 10-2011-0053817 A | 5/2011 |
| KR | 10-2020-0086218 A | 7/2020 |

\* cited by examiner

APPARATUS AND METHOD FOR TREATING SUBSTRATE INCLUDING PROCESS CHAMBERS AND TRANSFER CHAMBER

CROSS-REFERENCE TO THE RELATED APPLICATION

This application claims priority from Korean Patent Application No. 10-2021-0181340 filed on Dec. 17, 2021 in the Korean Intellectual Property Office, and all the benefits accruing therefrom under 35 U.S.C. 119, the contents of which in its entirety are herein incorporated by reference.

BACKGROUND

1. Technical Field

Embodiments of the present disclosure relate to an apparatus and method for treating a substrate.

2. Description of the Related Art

When manufacturing a semiconductor device or a display device, various processes such as photolithography, etching, ashing, ion implantation, thin-film deposition, cleaning, and the like are performed. For example, the photolithography process includes a coating process, an exposure process, and a developing process. A photoresist film is formed on a substrate (that is, a coating process), a circuit pattern is exposed on the substrate formed with the photoresist film (that is, an exposure process), and an exposed area of the substrate is selectively developed (that is, a developing process). Thereafter, a developer used in the developing process is dried. When the developer is spin-dried, problems such as leaning, bridge, hopping, etc. of the photoresist film, may occur. Further, the substrate that has been subjected to the exposure process may be moved several times within an apparatus. The substrate subjected to the exposure process is vulnerable to defects caused by moisture, organic fume, and the like.

SUMMARY

Aspects of the present disclosure provide an apparatus for treating a substrate capable of reducing process defects that may occur in the process of transferring a substrate subjected to an exposure process.

Aspects of the present disclosure also provide a method of treating a substrate capable of reducing process defects that may occur in the process of transferring a substrate subjected to an exposure process.

However, aspects of embodiments of the present disclosure are not restricted to those set forth herein. The above and other aspects of embodiments of the present disclosure will become more apparent to one of ordinary skill in the art to which the present disclosure pertains by referencing the detailed description of the present disclosure given below.

According to embodiments, an apparatus for treating a substrate is provided. The apparatus includes: at least one first process chamber configured to supply a developer onto the substrate; at least one second process chamber configured to treat the substrate using a supercritical fluid; a transfer chamber configured to transfer the substrate from the at least one first process chamber to the at least one second process chamber, while the developer supplied in the at least one first process chamber remains on the substrate; and a temperature and humidity control system configured to manage temperature and humidity of the transfer chamber by supplying a first gas of constant temperature and humidity into the transfer chamber.

According to embodiments, an apparatus for treating a substrate subjected to an exposure process is provided. The apparatus includes: an index module configured to receive the substrate subjected to the exposure process; and process modules for treating the substrate, the process modules including: at least one first process chamber configured to supply a developer onto the substrate, at least one second process chamber configured to dry the substrate, which has been treated in the at least one first process chamber, by using a first supercritical fluid, a third process chamber disposed to face at least a part of the at least one second process chamber and configured to dry the substrate, which has been treated in the at least one first process chamber, by using a second supercritical fluid, a fourth process chamber disposed to face at least a part of the at least one first process chamber and configured to bake the substrate which has been treated in the at least one second process chamber and the third process chamber, and a process module including a transfer chamber disposed between the at least one first process chamber and the fourth process chamber and between the at least one second process chamber and the third process chamber. The apparatus further includes: a temperature and humidity control system configured to manage temperature and humidity of the transfer chamber by supplying a first gas of constant temperature and humidity into the transfer chamber.

According to embodiments, a method of treating a substrate subjected to an exposure process is provided. The method includes: developing, in a first process chamber, the substrate subjected to the exposure process by supplying a developer to the substrate; transferring, through a transfer chamber, the substrate on which the developer supplied in the first process chamber remains to a second process chamber; drying, in the second process chamber, the substrate using a supercritical fluid; transferring, through the transfer chamber, the substrate dried in the second process chamber to a third process chamber; baking, in the third process chamber, the substrate; and managing temperature and humidity of the transfer chamber by supplying a gas of constant temperature and humidity to the transfer chamber.

It should be noted that the effects of the present disclosure are not limited to those described above, and other effects of the present disclosure will be apparent from the following description.

BRIEF DESCRIPTION OF THE DRAWINGS

The above and other aspects and features of the present disclosure will become more apparent by describing in detail non-limiting embodiments thereof with reference to the attached drawings, in which.

DETAILED DESCRIPTION

Figure 1:
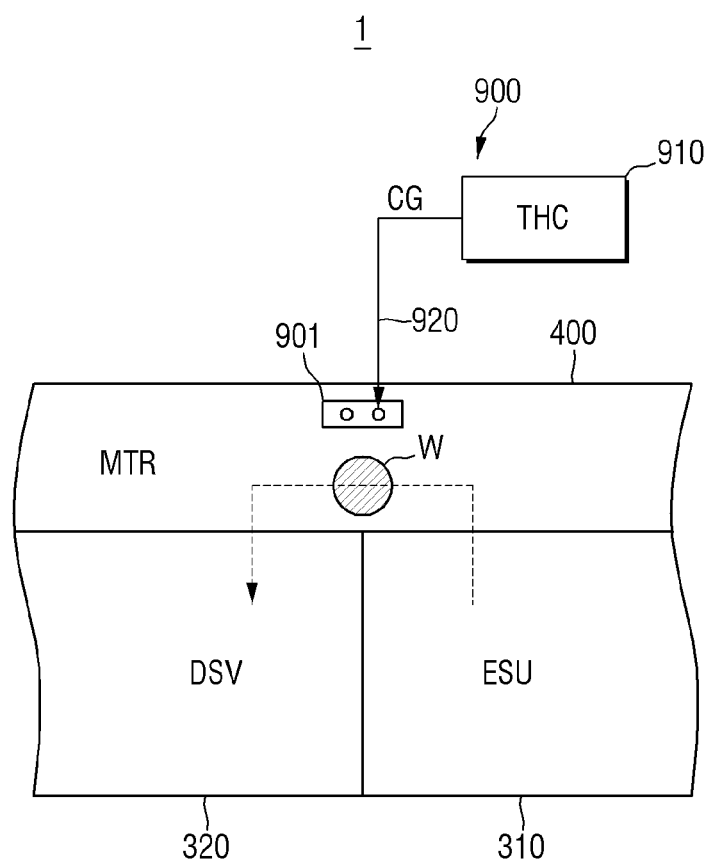
FIG. 1 is a schematic view for describing an apparatus for treating a substrate according to a first embodiment of the present disclosure.

Hereinafter, non-limiting example embodiments of the present disclosure will be described with reference to the attached drawings.

In the drawings, like elements are denoted by like reference numerals and repeated explanations thereof will therefore be omitted.

Figure 2:
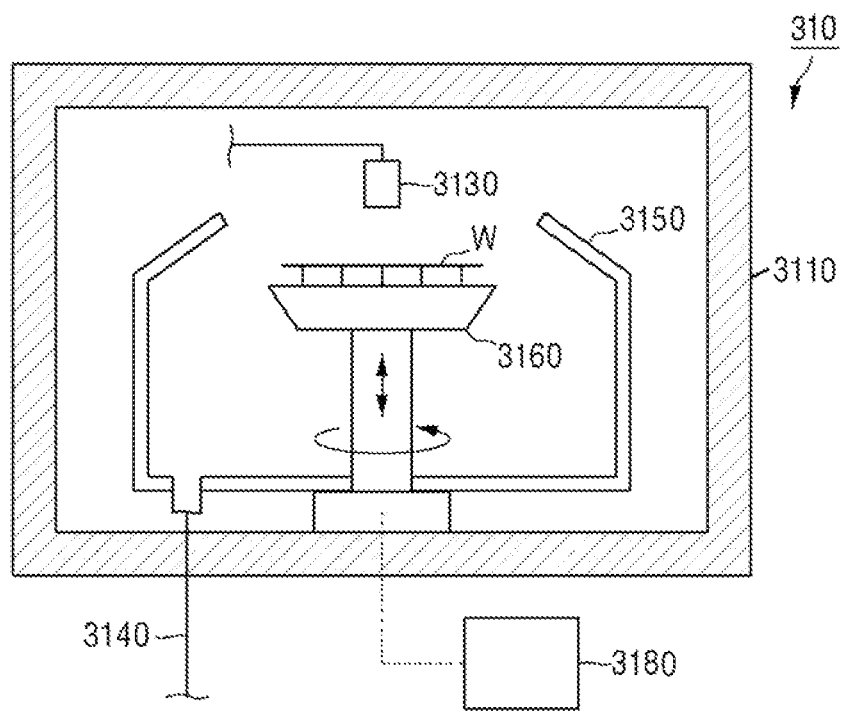
FIG. 2 is a schematic view illustrating an example of a first process chamber of FIG. 1.
Figure 3:
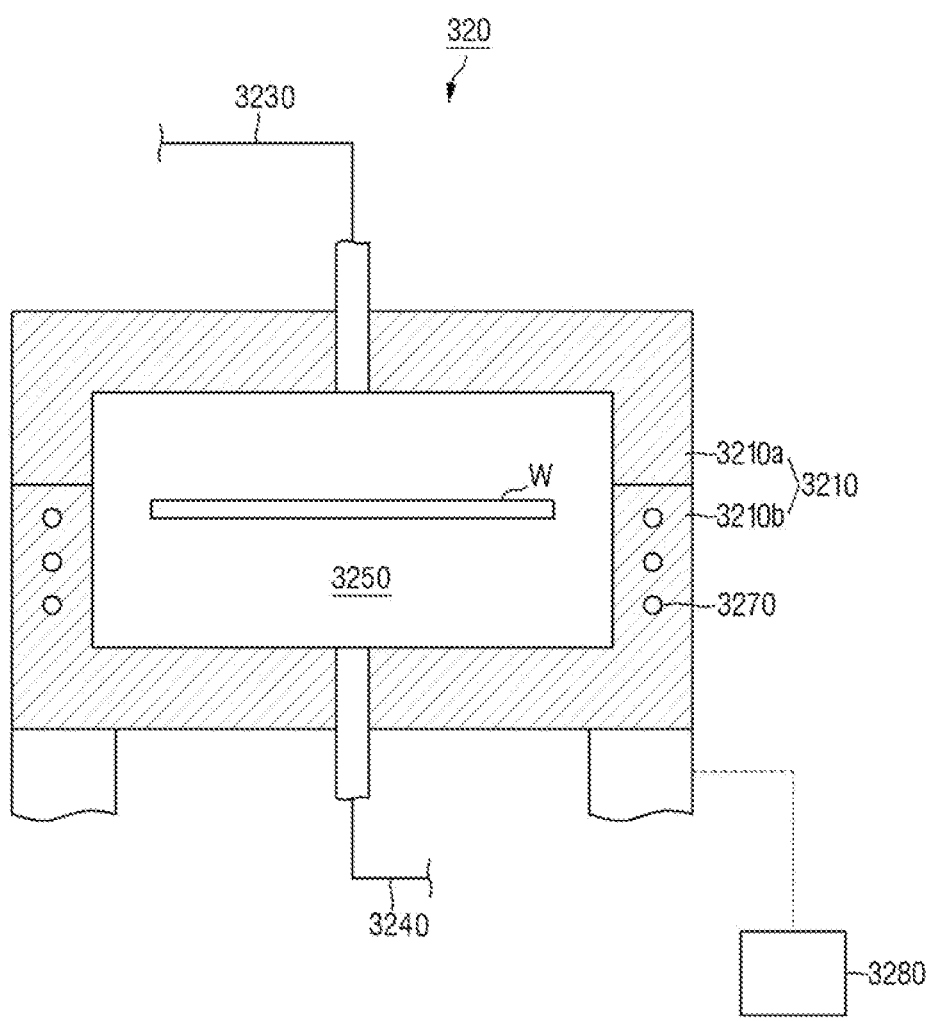
FIG. 3 is a schematic view illustrating an example of a second process chamber of FIG. 1.
Figure 4:
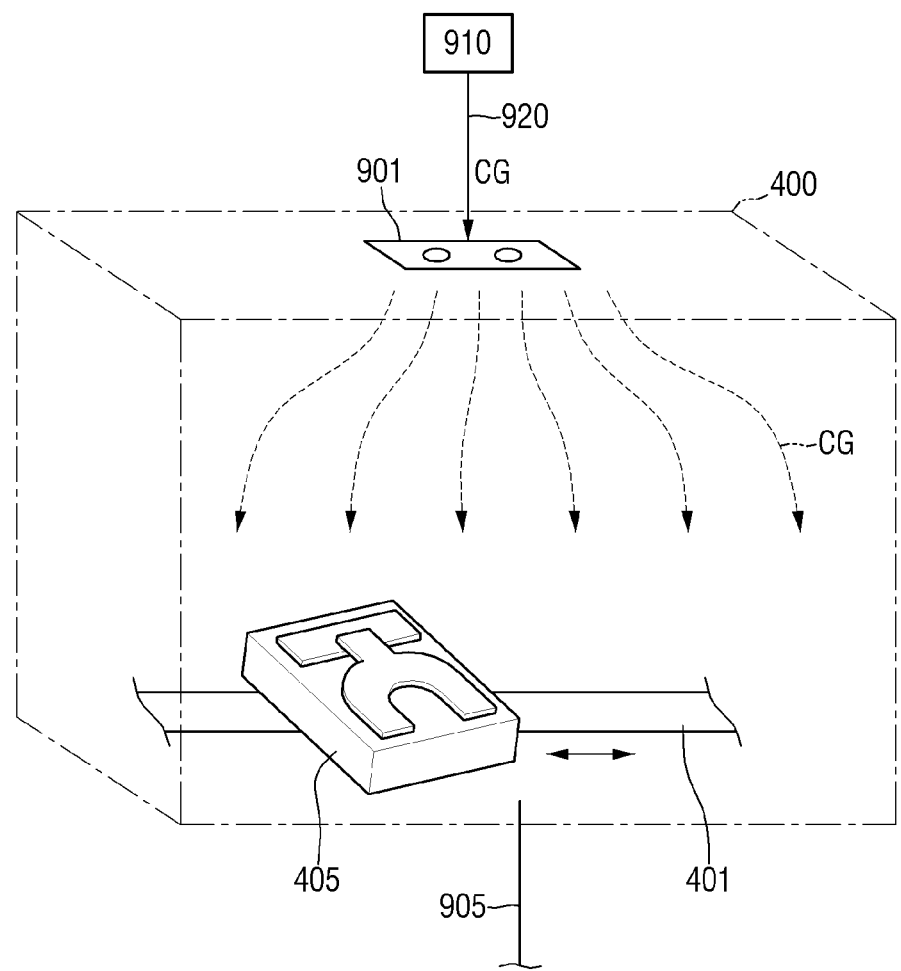
FIG. 4 is a schematic view illustrating an example of a transfer chamber of FIG. 1.

FIG. 1 is a schematic view for describing an apparatus for treating a substrate according to a first embodiment of the present disclosure. FIG. 2 is a schematic view illustrating an example of a first process chamber of FIG. 1. FIG. 3 is a schematic view illustrating an example of a second process chamber of FIG. 1. FIG. 4 is a schematic view illustrating an example of a transfer chamber of FIG. 1.

First, referring to FIG. 1, an apparatus 1 for treating a substrate according to a first embodiment of the present disclosure includes a first process chamber 310, a second process chamber 320, a transfer chamber 400, a temperature and humidity control system 900, and the like.

The first process chamber 310 supplies a developer to a substrate W to perform a developing process.

The substrate W may be a substrate subjected to an exposure process. That is, a photoresist film subjected to an exposure process has been formed on the substrate W. The photoresist film may be a negative tone development (NTD) film, and also a chemically amplified resist (CAR) film, but is not limited thereto.

The developer may include n-butyl acetate (nBA) as negative tone developer, but is not limited thereto.

The second process chamber 320 uses a supercritical fluid to dry the substrate W. That is, the developer remaining on the substrate W is removed using the supercritical fluid. The supercritical fluid may be, for example, carbon dioxide in a supercritical state. The supercritical fluid has high permeability, and thus can effectively remove the developer remaining between photoresist film patterns.

The transfer chamber 400 serves to transfer the substrate W. For example, the transfer chamber 400 may transfer the substrate W to the first process chamber 310, transfer the substrate W developed in the first process chamber 310 to the second process chamber 320, or transfer the substrate W dried in the second process chamber 320 to another chamber (not shown).

The temperature and humidity control system 900 supplies a gas CG of constant temperature and humidity into the transfer chamber 400 to manage the temperature and humidity of the transfer chamber 400.

The temperature and humidity control system 900 may include a gas providing unit 910, a main supply pipe 920 connected to the gas providing unit 910 to deliver the gas of constant temperature and humidity, and a connection part 901 for connecting the main supply pipe 920 and the transfer chamber 400.

According to embodiments, the gas providing unit 910 may include at least one body configured to provide one or more gases. For example, the gas providing unit 910 may include at least one from among a tank(s), pipe(s), valve(s), and pump(s) that is configured to provide the one or more gases to the main supply pipe 920.

Here, the gas providing unit 910 may be located, for example, higher than the transfer chamber 400, substantially at the same level (or height) as the transfer chamber 400, or lower than the transfer chamber 400. The position and configuration of the main supply pipe 920 may vary according to the position of the gas providing unit 910.

The reason that the temperature and humidity control system 900 manages the temperature and humidity of the transfer chamber 400 is as follows:

On the substrate W transferred from the first process chamber 310 to the second process chamber 320, a developer supplied in the first process chamber 310 may remain.

The substrate W is transferred, with the developer remaining thereon (i.e., in a wet state), so that the substrate W is not dried while moving. If the substrate W is moved in a dry state, foreign substances may fall on the substrate W and cause a defect, and even a weak impact may damage the photoresist film or an etched film (i.e., causing undulations).

On the other hand, when the substrate W is transferred with the developer remaining thereon, organic particles generated from the developer, the photoresist film, etc. on the substrate W may cross contaminate the chambers.

The temperature and humidity control system 900 supplies the gas CG of constant temperature and humidity to the transfer chamber 400 to prevent cross contamination by organic particles. The gas CG of constant temperature and humidity is supplied from an upper surface of the transfer chamber 400 by the temperature and humidity control system 900 so that a downflow is formed. The gas CG of constant temperature and humidity flowing downward is exhausted at a bottom surface of the transfer chamber 400. By doing so, it is possible to prevent cross-contamination of the chambers.

Referring to FIG. 2, the first process chamber 310 includes a housing 3110, a cup 3150, a support unit 3160, a liquid supply unit 3130, a driving unit 3180, and the like.

The support unit 3160 is disposed inside the housing 3110. The support unit 3160 supports or fixes the substrate W. The support unit 3160 may be rotated or raised or lowered in a vertical direction by the driving unit 3180.

The cup 3150 is formed to surround the periphery of the support unit 3160. That is, the cup 3150 has a processing space with an open top. The cup 3150 is provided to recover a chemical liquid used in a process, and the chemical liquid collected in the cup 3150 may be recovered through a recovery line 3140.

The liquid supply unit 3130 supplies a chemical liquid (i.e., developer) to the substrate W disposed on the support unit 3160. Although not illustrated, the liquid supply unit 3130 may include a storage tank for storing a chemical liquid, a pipe connected to the storage tank, a plurality of valves installed in the pipe to determine the amount and supply of the chemical liquid, and a nozzle for discharging the chemical liquid, and the like.

In the drawings, it is illustrated that one chemical liquid is used, for example, one nozzle and one cup are illustrated, but embodiments of the present disclosure are not limited thereto. When two or more chemical liquids are used, two or more nozzles and two or more cups may be installed. For example, before supplying a developer onto the substrate W, a cleaning liquid may be supplied onto the substrate W to clean the substrate W. In addition, after performing development by supplying the developer to the substrate W, the developer remaining on the substrate W may be substituted with another chemical liquid (e.g., a rinse liquid) in order to prevent excessive development. In these cases, two or more nozzles and two or more cups may be installed.

Here, referring to FIG. 3, the second process chamber 320 may include a body 3210, a heater 3270, a fluid supply line 3230, an exhaust line 3240, and the like.

The body 3210 may include an interior space 3250 in which a dry process is performed. The body 3210 may have an upper body 3210a and a lower body 3210b, and the upper body 3210a and the lower body 3210b may be coupled together to provide the interior space 3250. The upper body 3210a may be fixed in its position and the lower body 3210b may be raised or lowered by a driving member 3280, such as a cylinder. When the lower body 3210b is spaced apart from the upper body 3210a, the interior space 3250 is opened and at this time, the substrate W is loaded or unloaded. During the process, the lower body 3210b is in close contact with the upper body 3210a so that the interior space 3250 is sealed from the outside. The second process chamber 320 has a heater 3270. For example, the heater 3270 is positioned inside a wall of the body 3210. The heater 3270 heats the interior space 3250 of the body 3210 so that a fluid supplied into the interior space 3250 of the body 3210 maintains a supercritical state. A supercritical fluid (e.g., carbon dioxide) is supplied to the interior space 3250 through a fluid supply line 3230 connected to the upper body 3210a. Through the exhaust line 3240 connected to the lower body 3210b, the used supercritical fluid is exhausted to the outside.

Here, referring to FIG. 4, the transfer chamber 400 includes a guide rail 401 elongated in one direction and a transfer robot 405 moving along the guide rail 401. The transfer robot 405 may include an arm and a hand. The transfer robot 405 transfers the substrate W to the first process chamber 310 or the second process chamber 320 while moving along the guide rail 401.

Meanwhile, a connection part 901 is installed on the upper surface of the transfer chamber 400, and the connection part 901 is connected to the main supply pipe 920 of the temperature and humidity control system 900. The gas CG of constant temperature and humidity is supplied into the transfer chamber 400 through the connection part 901, and a downflow of the gas CG of constant temperature and humidity is formed.

A plurality of exhaust ports (not shown) and an exhaust line 905 may be installed on a lower surface of the transfer chamber 400 so that the gas CG of constant temperature and humidity flowing downward may be exhausted to the outside of the transfer chamber 400.

Figure 5:
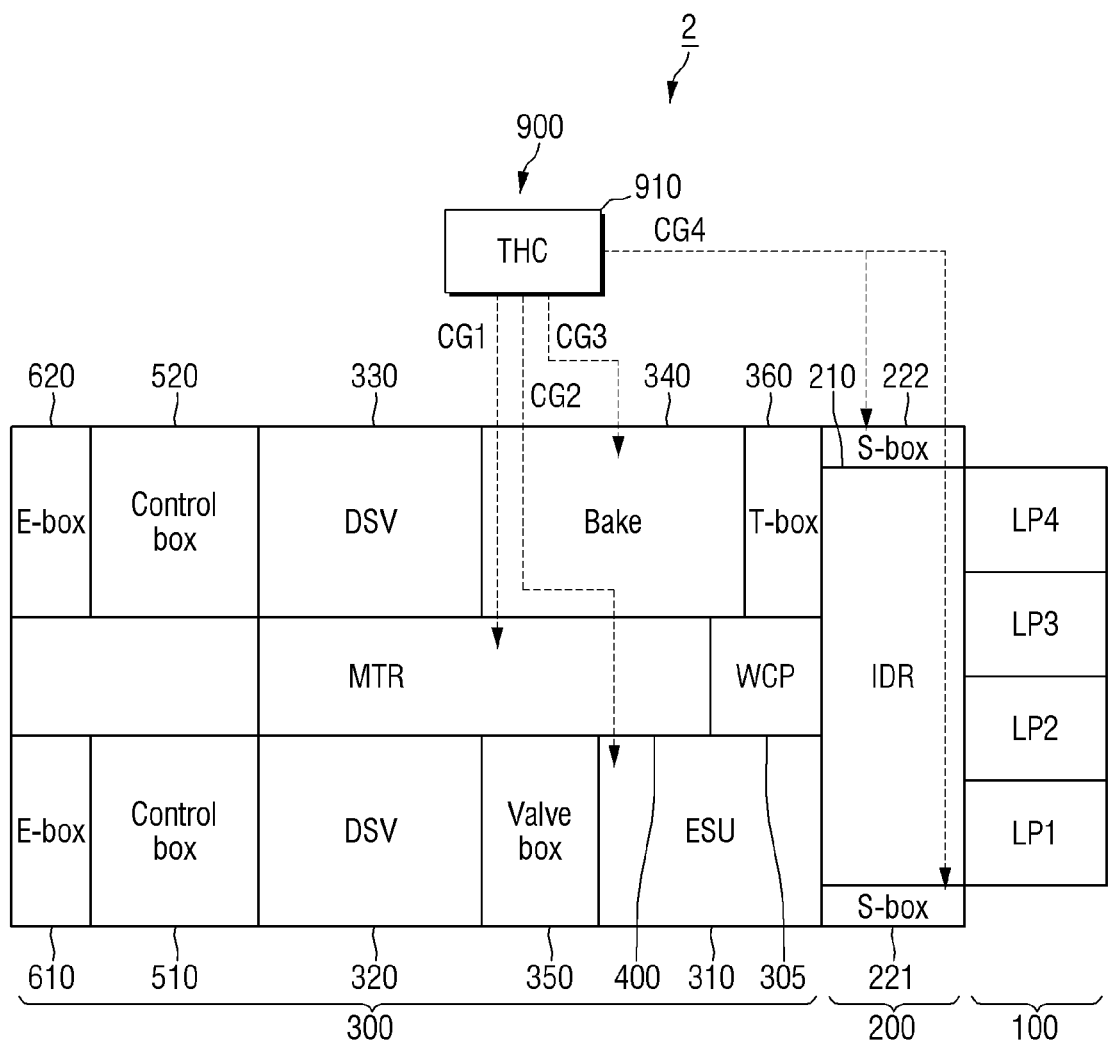
FIG. 5 is a conceptual diagram for describing an apparatus for treating a substrate according to a second embodiment of the present disclosure.

FIG. 5 is a conceptual diagram for describing an apparatus for treating a substrate according to a second embodiment of the present disclosure. For simplicity, the second embodiment will hereinafter be described, focusing mainly on differences with the embodiment of FIGS. 1 to 4.

Referring to FIG. 5, a substrate on which a photoresist film subjected to an exposure process is formed is transferred into an apparatus 2 for treating a substrate. In the apparatus 2 for treating a substrate, a developing process using a developer, a dry process using a supercritical fluid, and a bake process are sequentially performed.

The apparatus for treating a substrate according to some embodiments of the present disclosure includes a load port 100, an index module 200, a process module 300, and a temperature and humidity control system 900.

The load port 100, the index module 200, and the process module 300 may be disposed along a first direction X.

The load port 100 includes loading plates LP1 to LP4 on which a container accommodating a plurality of substrates is placed. The plurality of substrates may be substrates subjected to the exposure process. The container may be, for example, a front opening unified pod (FOUP), but is not limited thereto. The plurality of loading plates may be disposed along a second direction Y. FIG. 5 illustrates that four loading plates are installed.

The index module 200 is disposed between the load port 100 and the process module 300. For example, the index module 200 may include a rail installed inside the index chamber 210 and an index robot moving along the rail. The index robot includes an arm and a hand to pick up the substrate located in the load port 100 and transfer the substrate to a buffer chamber 305.

The process module 300 includes the buffer chamber 305, a transfer chamber 400, a first process chamber 310, a second process chamber 320, a third process chamber 330, a fourth process chamber 340, a valve box 350, a first control box 510, a second control box 520, a first exhaust box 610, a second exhaust box 620, an electrical equipment box 360, and the like.

The buffer chamber 305 temporarily stores a substrate delivered by the index robot of the index module 200. In addition, a substrate on which a preset process has been completed may be temporarily stored in at least one process chamber (e.g., the first process chamber 310, the second process chamber 320, the third process chamber 330, or the fourth process chamber 340).

The transfer chamber 400 is elongated along the first direction X. A guide rail and a transfer robot moving along the guide rail are installed inside the transfer chamber 400.

The first process chamber 310, the valve box 350, the second process chamber 320, the first control box 510, and the first exhaust box 610 may be disposed in this order on one side in the second direction Y with respect to the transfer chamber 400. Also, the electrical equipment box 360, the fourth process chamber 340, the third process chamber 330, the second control box 520, and the second exhaust box 620 may be disposed in this order on the other side in the second direction Y with respect to the transfer chamber 400. That is, the transfer chamber 400 may be disposed across between the first process chamber 310 and the fourth process chamber 340, and between the second process chamber 320 and the third process chamber 330.

The first process chamber 310 supplies a developer to a substrate to perform a developing process. A photoresist subjected to an exposure process may have been formed on the substrate. The developer may include n-butyl acetate (nBA) as negative tone developer, but is not limited thereto.

The second process chamber 320 uses a supercritical fluid to dry the substrate. That is, the developer remaining on the substrate W is removed using the supercritical fluid. The supercritical fluid may be, for example, carbon dioxide in a supercritical state.

The third process chamber 330 may be a chamber of the same type as the second process chamber 320. That is, the third process chamber 330 uses a supercritical fluid to dry the substrate. The third process chamber 330 may be disposed to face at least a part of the second process chamber 320.

The fourth process chamber 340 bakes the substrate dried in the second process chamber 320 or the third process chamber 330. As baking proceeds in the fourth process chamber 340, the chemical liquid (or moisture) remaining on the substrate W is removed. The fourth process chamber 340 may be disposed to face at least a part of the first process chamber 310.

The valve box 350 is a space in which pipes and valves for supplying a chemical liquid (e.g., at least one of a developer, a cleaning liquid, or a rinse liquid) and/or a supercritical fluid (e.g., carbon dioxide) to at least one of the process chambers (e.g., the first process chamber 310, the second process chamber 320, and the third process chamber 330).

The first control box 510 is a space in which a controller (i.e., a computing device) for controlling the plurality of process chambers (e.g., the first process chamber 310 and the second process chamber 320) and/or the valve box 350 is installed.

The second control box 520 is a space in which a controller (i.e., a computing device) for controlling the plurality of process chambers (e.g., the third process chamber 330 and the fourth process chamber 340), etc. are installed.

The electrical equipment box 360 may be a space in which a plurality of electrical devices are installed. For example, in the electrical equipment box 360, electrical devices related to the fourth process chamber 340 disposed adjacent to the electrical equipment box 360 may be installed, but embodiments of the present disclosure are not limited thereto.

In addition, the first exhaust box 610 may be disposed on one side (e.g., one side in the first direction X) of the second process chamber 320. As will be described below, an exhaust line for exhausting fume and/or heat generated in the second process chamber 320 using negative pressure is installed in the first exhaust box 610.

The second exhaust box 620 may be disposed on one side (e.g., one side in the first direction X) of the third process chamber 330. As will be described below, the second exhaust box 620 has a structure similar to that of the first exhaust box 610, in which an exhaust line for exhausting fume and/or heat generated in the third process chamber 330 using negative pressure is installed.

In the apparatus for treating a substrate according to the second embodiment, the temperature and humidity control system 900 may supply gas CG1, gas CG2, gas CG3, and gas CG4 of constant temperature and humidity to at least one from among the transfer chamber 400, the first process chamber 310, the fourth process chamber 340, and the index module 200.

Specifically, the temperature and humidity control system 900 may include a gas providing unit 910, and the gas providing unit 910 may be located, for example, higher than the transfer chamber 400, substantially at the same level (or height) as the transfer chamber 400, or lower than the transfer chamber 400.

The temperature and humidity control system 900 supplies the gas CG1 of constant temperature and humidity into the transfer chamber 400 to manage the temperature and humidity of the transfer chamber 400. For example, the gas CG1 of constant temperature and humidity is supplied from an upper surface of the transfer chamber 400 so that a downflow is formed in the transfer chamber 400.

Also, the temperature and humidity control system 900 supplies the gas CG2 of constant temperature and humidity into the first process chamber 310 to manage the first process chamber 310. As will be described below, a supply pipe connected to the gas providing unit 910 may pass through the valve box 350 and be connected to the first process chamber 310.

In addition, the temperature and humidity control system 900 may supply the gas CG3 of constant temperature and humidity into the fourth process chamber 340 to manage the temperature and humidity of the fourth process chamber 340. As will be described below, the supply pipe connected to the gas providing unit 910 may pass through the electrical equipment box 360 and be connected to the fourth process chamber 340.

In addition, the temperature and humidity control system 900 supplies the gas CG4 of constant temperature and humidity into the index module 200 to manage the index module 200. The temperature and humidity control system 900 supplies the gas CG4 of constant temperature and humidity into the index module 200 through the airflow supply box 221 and the airflow supply box 222. The airflow supply box 221 and the airflow supply box 222 may be installed on at least one side (e.g., one side in the second direction Y) of the index module 200. The supply pipe connected to the gas providing unit 910 is connected to upper surfaces of the airflow supply box 221 and the airflow supply box 222 so that the gas CG4 of constant temperature and humidity is supplied from the upper surface of the index module 200 and thus a downflow is formed in the transfer chamber 400.

Hereinafter, the operation of the apparatus for treating a substrate according to the second embodiment of the present disclosure will be described.

A container accommodating a substrate subjected to the exposure process is placed on the loading plate of the load port 100. The index robot of the index module 200 picks up the substrate and delivers the substrate to the buffer chamber 305.

The transfer robot of the transfer chamber 400 picks up the substrate from the buffer chamber 305 and transfers the substrate to the first process chamber 310. The substrate is developed with a developer in the first process chamber 310. The transfer robot of the transfer chamber 400 transfers the substrate from the first process chamber 310 to the second process chamber 320 or the third process chamber 330. In particular, the developer supplied in the first process chamber 310 remains on the substrate and is transferred to the second process chamber 320 or the third process chamber 330.

In the second process chamber 320 or the third process chamber 330, the substrate is dried by a supercritical fluid. The transfer robot of the transfer chamber 400 delivers the dried substrate from the second process chamber 320 or the third process chamber 330 to the fourth process chamber 340.

The substrate is baked in the fourth process chamber 340. The transfer robot of the transfer chamber 400 delivers the baked substrate from the fourth process chamber 340 to the buffer chamber 305.

The index robot of the index module 200 picks up the substrate and delivers the substrate into the container on the load port 100.

The temperature and humidity control system 900 may provide the gas CG1, the gas CG2, the gas CG3, and the gas CG4 of constant temperature and humidity to the index module 200, the transfer chamber 400, the first process chamber 310, and the fourth process chamber 340. In this way, the temperature and humidity of the apparatus 2 for treating a substrate are generally managed.

The index module 200, the transfer chamber 400, the first process chamber 310, and the fourth process chamber 340 are not separately managed, and the temperature and humidity of the index module 200, the transfer chamber 400, the first process chamber 310, and the fourth process chamber 340 may be managed as a whole by the gas CG1, the gas CG2, the gas CG3, and the gas CG4 of constant temperature and humidity.

The transfer chamber 400 transfers the substrate with the developer remaining thereon, and the developer on the substrate W and organic particles generated from the photoresist film may cross-contaminate the chambers. The temperature and humidity control system 900 supplies the gas CG1 of constant temperature and humidity to the transfer chamber 400 to prevent cross-contamination by organic particles.

In addition, the humidity of the index module 200, the transfer chamber 400, the first process chamber 310, and the fourth process chamber 340 may be maintained at a preset humidity (e.g., 40 to 45%), and the temperature may be maintained at a preset temperature. In the photolithography process using the photoresist film and a developer (organic developer), agglomerated particles may be generated according to the change in temperature/humidity. According to embodiments of the present disclosure, the temperature/humidity of the first process chamber 310, the fourth process chamber, and the index module 200 are maintained constant by the gas CG2, the gas CG3, and the gas CG4 of constant temperature and humidity, and thus agglomerated particles are not generated.

Additionally, the temperature and humidity control system 900 may also supply a gas of constant temperature and humidity to the second process chamber 320 and the third process chamber 330 to manage the temperature and humidity of the second process chamber 320 and the third process chamber 330.

Figure 6:
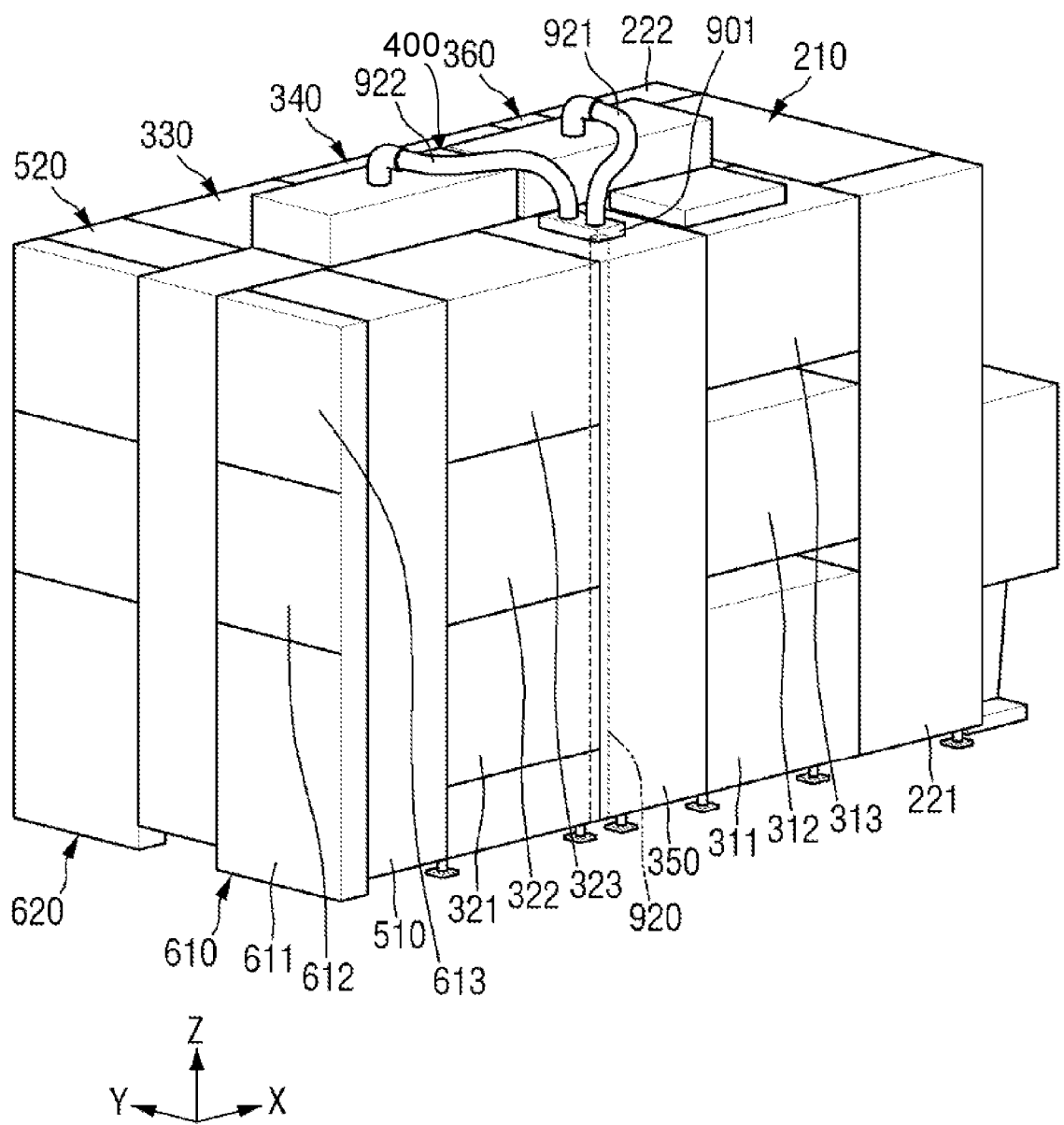
FIG. 6 is an example view illustrating supplying a gas of constant temperature and humidity to a transfer chamber of the apparatus for treating a substrate of FIG. 5.

FIG. 6 is an example view illustrating supplying a gas of constant temperature and humidity to a transfer chamber of the apparatus for treating a substrate of FIG. 5. For simplicity, the current embodiment will hereinafter be described, focusing mainly on differences with the embodiments of FIGS. 1 to 5.

Referring to FIG. 6, a plurality of first process chambers 311, 312, and 313 may be provided, and the plurality of first process chambers 311, 312, and 313 may be stacked in a third direction Z.

A plurality of second process chambers 321, 322, and 323 may be provided, and the plurality of second process chambers 321, 322, and 323 may be stacked in the third direction Z.

The valve box 350 may be elongated along the direction in which the plurality of first process chambers 311, 312, and 313 are stacked and the direction in which the plurality of second process chambers 321, 322, and 323 are stacked.

The first control box 510 may be elongated along the direction in which the plurality of second process chambers 321, 322, and 323 are stacked.

The first exhaust box 610 may include a plurality of exhaust boxes 611, 612, and 613, and the plurality of exhaust boxes 611, 612, and 613 may be stacked in the third direction Z. The interiors of the plurality of exhaust boxes 611, 612, and 613 may communicate with each other without being distinguished from one another.

Although not separately illustrated, the gas providing unit 910 (see. e.g., FIG. 5) may be located lower than the transfer chamber 400 (and/or the valve box 350). For example, the gas providing unit 910 may be located below the bottom surface of a manufacturing plant which supports the load port 100, the index module 200, and the process module 300.

In this case, a supply pipe structure of the temperature and humidity control system 900 (see. e.g., FIG. 5) includes a main supply pipe 920 and sub-supply pipes (e.g., a first sub-pipe 921 and a second sub-pipe 922). The main supply pipe 920 passes through the valve box 350. That is, the main supply pipe 920 is installed to extend from the lower portion of the valve box 350 to the upper surface of the valve box 350. The main supply pipe 920 may be branched off into the first sub-pipe 921 and the second sub-pipe 922.

The first sub-pipe 921 may supply a gas of constant temperature and humidity to a part (the front half) of the transfer chamber 400, and the second sub-pipe 922 may supply the gas of constant temperature and humidity to the other part (the rear half) of the transfer chamber 400.

Since the transfer chamber 400 is elongated along the first direction X, the gas of constant temperature and humidity may be supplied through at least two sub-pipes (e.g., the first sub-pipe 921 and the second sub-pipe 922). For example, the front portion, the middle portion, and the rear portion of the transfer chamber 400 may be supplied with a gas of constant temperature and humidity using three sub-pipes, respectively. In this way, the temperature and humidity of the transfer chamber 400 elongated along the first direction X may be managed as a whole.

Even in a case where the gas providing unit 910 may be disposed spaced apart from the load port 100, the index module 200, and the process module 300 and is installed above the bottom surface of the manufacturing plant unlike the embodiment described above, the gas providing unit 910 may be connected to the main supply pipe 920 through a connection pipe (not shown) installed below the bottom surface of the manufacturing plant.

Figure 7:
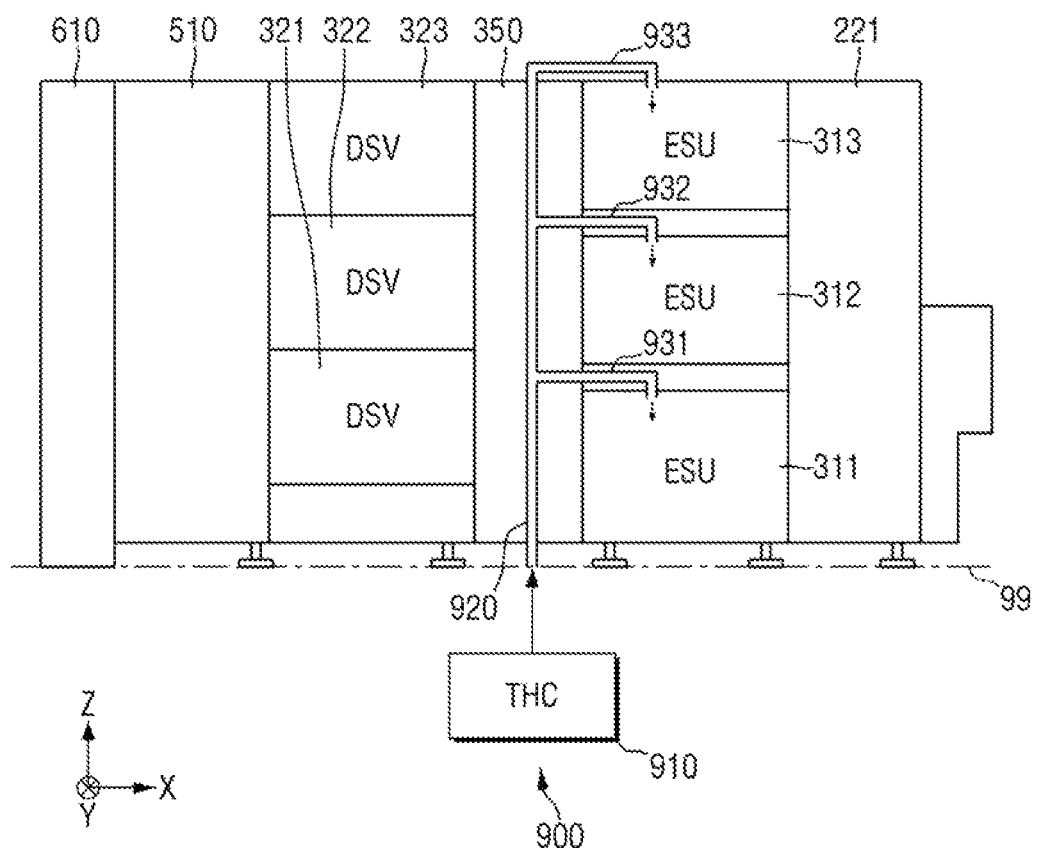
FIG. 7 is an example view illustrating supplying a gas of constant temperature and humidity to a first process chamber of the apparatus for treating a substrate of FIG. 5.

FIG. 7 is an example view illustrating supplying a gas of constant temperature and humidity to a first process chamber of the apparatus for treating a substrate of FIG. 5. For simplicity, the current embodiment will hereinafter be described, focusing mainly on differences with the embodiments of FIGS. 1 to 6.

Referring to FIG. 7, a plurality of first process chambers 311, 312, and 313 may be provided, and the plurality of first process chambers 311, 312, and 313 may be stacked in the third direction Z. The valve box 350 may be elongated along the direction in which the plurality of first process chambers 311, 312, and 313 are stacked.

The gas providing unit 910 of the temperature and humidity control system 900 may be located lower than the transfer chamber 400. For example, the gas providing unit 910 may be located below the bottom surface 99 of the manufacturing plant which supports the load port 100, the index module 200, and the process module 300.

In this case, the supply pipe structure of the temperature and humidity control system 900 includes a main supply pipe 920, a sub-supply pipe 931, a sub-supply pipe 932, and a sub-supply pipe 933. The main supply pipe 920 passes through the valve box 350. That is, the main supply pipe 920 is installed to extend from the lower portion of the valve box 350 to the upper surface of the valve box 350. The sub-supply pipe 931, the sub-supply pipe 932, and the sub-supply pipe 933 may be branched off from the main supply pipe 920 and connected to the plurality of first process chambers 311, 312, and 313, respectively. The sub-supply pipe 931, the sub-supply pipe 932, and the sub-supply pipe 933 may extend through the ceilings of the first process chambers 311, 312, and 313, respectively. For example, the sub-supply pipe 931 may supply a gas of constant temperature and humidity to the first process chamber 311 through a space between the first process chambers 311 and 312 installed on the first and second floors. The sub-supply pipe 932 may supply a gas of constant temperature and humidity to the first process chamber 312 through a space between the first process chambers 312 and 313 installed on the second and third floors. The sub-supply pipe 933 may supply a gas of constant temperature and humidity to the first process chamber 313 through a space in an upper portion of the first process chamber 313 installed on the third floor.

Figure 8:
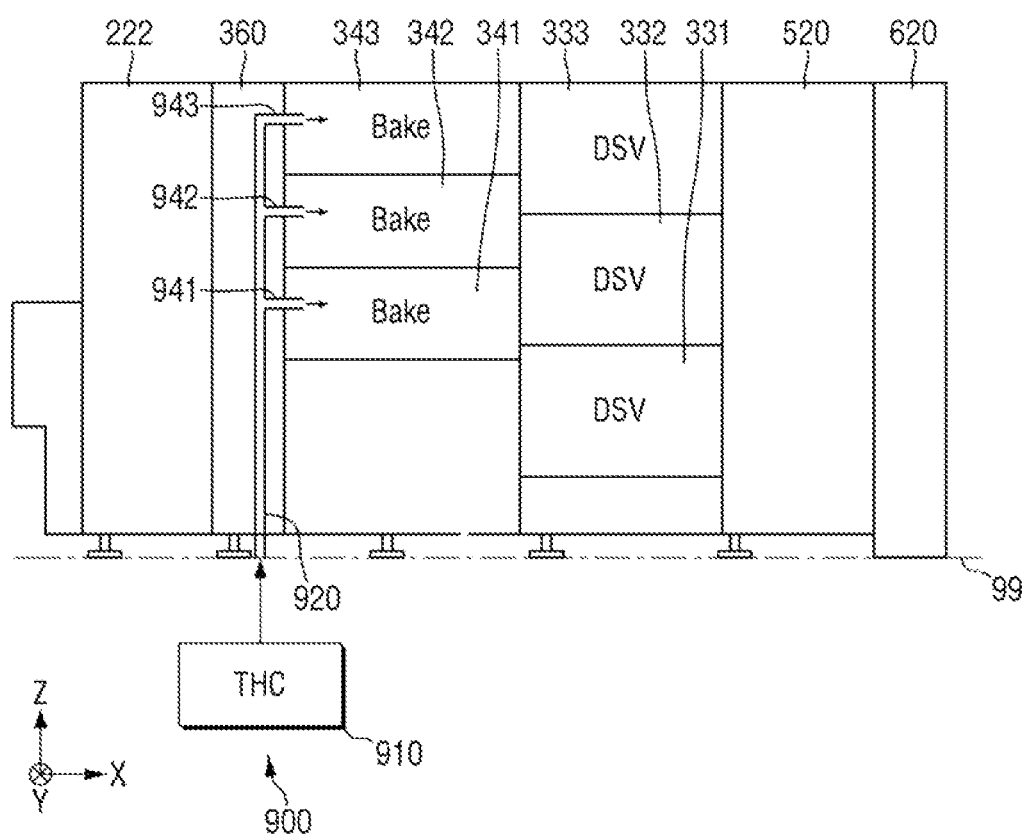
FIG. 8 is an example view illustrating supplying a gas of constant temperature and humidity to a fourth process chamber of the apparatus for treating a substrate of FIG. 5.

FIG. 8 is an example view illustrating supplying a gas of constant temperature and humidity to a fourth process chamber of the apparatus for treating a substrate of FIG. 5. For simplicity, the second embodiment will hereinafter be described, focusing mainly on differences with the embodiments of FIGS. 1 to 7.

Referring to FIG. 8, a plurality of fourth process chambers 341, 342, and 343 may be provided, and the plurality of fourth process chambers 341, 342, and 343 may be stacked in the third direction Z. The electrical equipment box 360 may be elongated along the direction in which the plurality of fourth process chambers 341, 342, and 343 are stacked.

The gas providing unit 910 of the temperature and humidity control system 900 may be located lower than the electrical equipment box 360. For example, the gas providing unit 910 may be located below the bottom surface 99 of the manufacturing plant.

In this case, the supply pipe structure of the temperature and humidity control system 900 includes a main supply pipe 920, a sub-supply pipe 941, a sub-supply pipe 942, and a sub-supply pipe 943. The main supply pipe 920 passes through the electrical equipment box 360. That is, the main supply pipe 920 is installed to extend from the lower portion of the electrical equipment box 360 to the upper surface of the electrical equipment box 360. The sub-supply pipe 941, the sub-supply pipe 942, and the sub-supply pipe 943 may be branched off from the main supply pipe 920 and connected to the plurality of fourth process chambers 341, 342, and 343, respectively. The sub-supply pipe 941, the sub-supply pipe 942, and the sub-supply pipe 943 may extend through the side walls of the fourth process chambers 341, 342, and 343, respectively, or through the upper surfaces of the fourth process chambers 341, 342, and 343.

Figure 9:
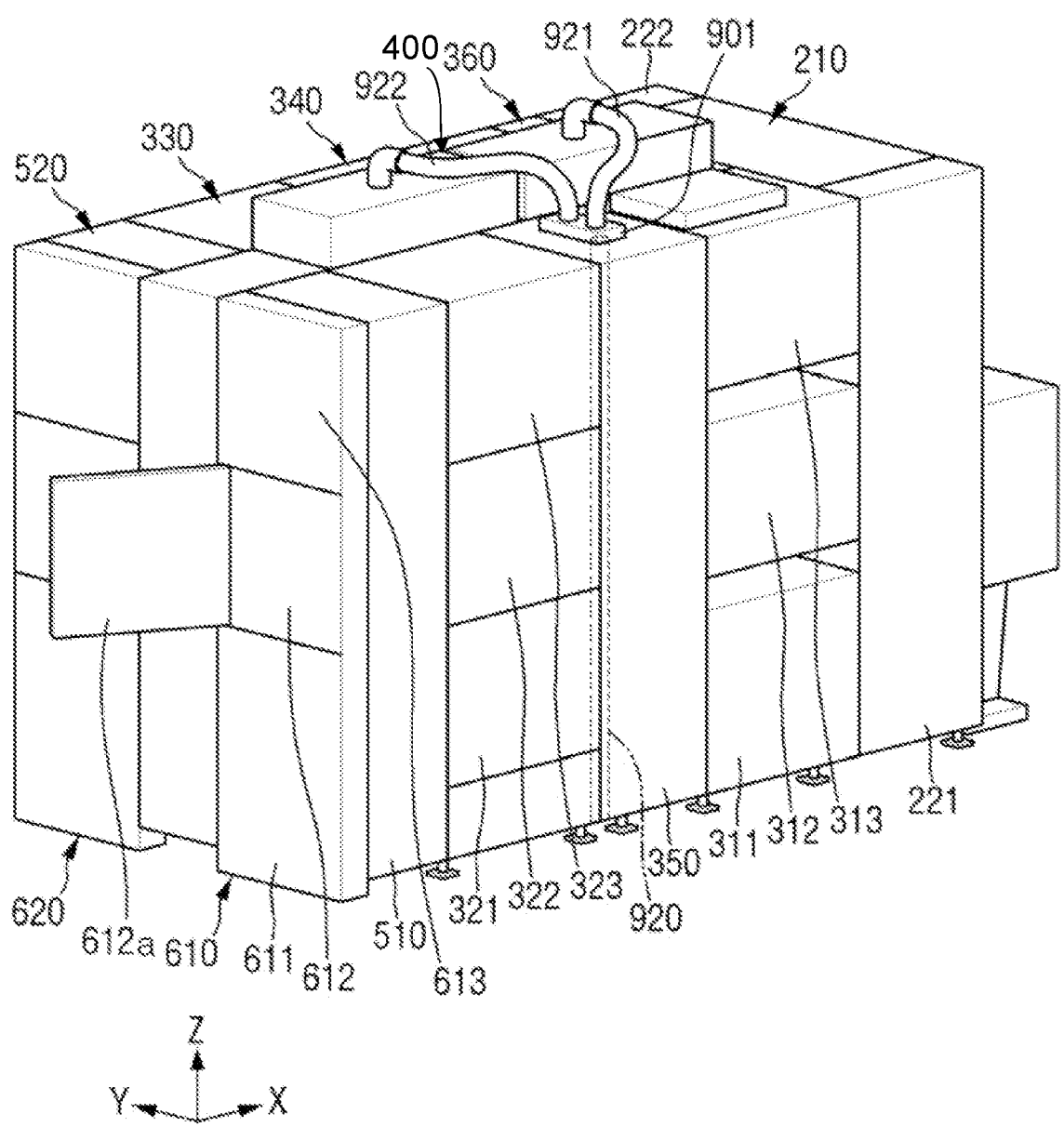
FIG. 9 is a view illustrating an open door of an exhaust box of the apparatus for treating a substrate of FIG. 5.
Figure 10:
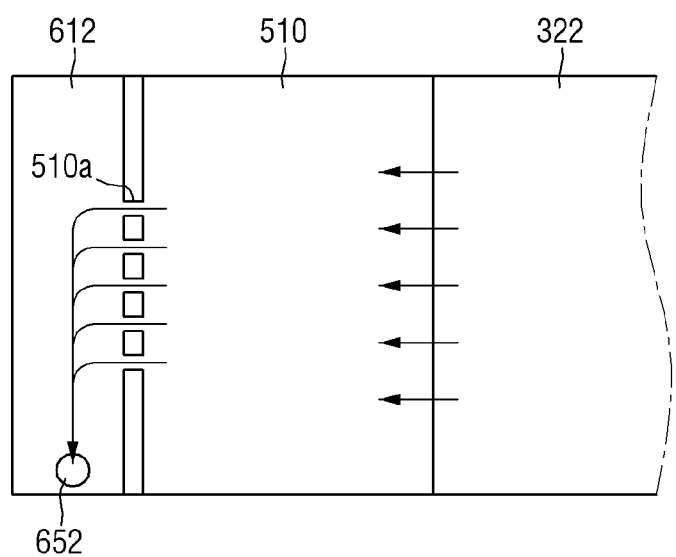
FIG. 10 is a conceptual diagram for explaining an operation of the exhaust box.
Figure 11:
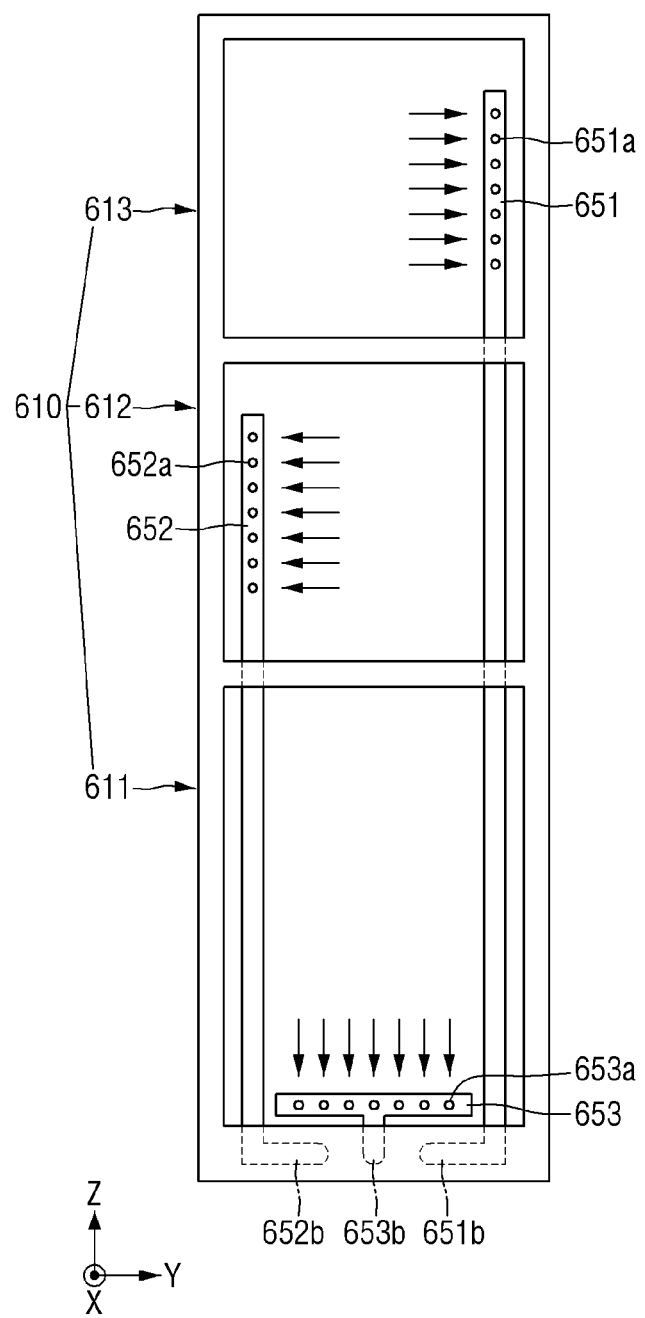
FIG. 11 is a front view illustrating exhaust lines installed in the exhaust box.

FIGS. 9 to 11 are diagrams for describing an exhaust box of the apparatus for treating a substrate of FIG. 5. FIG. 9 is a view illustrating an open door of an exhaust box of the apparatus for treating a substrate of FIG. 5. FIG. 10 is a conceptual diagram for explaining an operation of the exhaust box. FIG. 11 is a front view illustrating exhaust lines installed in the exhaust box. For simplicity, the second embodiment will hereinafter be described, focusing mainly on differences with the embodiments of FIGS. 1 to 8.

Referring to FIG. 9, the first exhaust box 610 may be elongated in a direction in which the second process chambers 321, 322, and 323 are stacked. The first exhaust box 610 may include a plurality of exhaust boxes 611, 612, and 613, and the plurality of exhaust boxes 611, 612, and 613 may be stacked in the third direction Z. The interiors of the plurality of exhaust boxes 611, 612, and 613 may communicate with each other without being distinguished from one another. Each of the exhaust boxes 611, 612, and 613 may have an openable door 612a.

Here, as shown in FIG. 10, a corresponding exhaust box 612 may be disposed on one side of the first control box 510, and a hole 510a may be formed on one side of the first control box 510. A second exhaust line 652 that provides a negative pressure may be disposed in the exhaust box 612.

Fume and heat generated in the second process chamber 322 may flow into the first control box 510. Organic fume and heat enter the exhaust box 612 through the hole 510a and are exhausted through the second exhaust line 652 that provides a negative pressure.

Referring to FIG. 11, a plurality of exhaust lines (e.g., a first exhaust line 651, a second exhaust line 652, and a third exhaust line 653) may be installed in the first exhaust box 610.

The first exhaust line 651 is disposed on a first side (e.g., the right side) of the first exhaust box 610. One end of the first exhaust line 651 extends to the exhaust box 613 (i.e., a height corresponding to the second process chamber 323) located on the third floor, and the other end 651b of the first exhaust line 651 extends to the bottom of the first exhaust box 610. The first exhaust line 651 may exhaust the fume generated in any one (e.g., the second process chamber 323) of the plurality of second process chambers 321, 322, and 323. A plurality of exhaust holes 651a for providing a negative pressure are installed in the first exhaust line 651.

The second exhaust line 652 is disposed on a second side (e.g., the left side) of the first exhaust box 610. One end of the second exhaust line 652 extends to the exhaust box 612 (i.e., a height corresponding to the second process chamber 322) located on the second floor, and the other end 652b of the second exhaust line 652 extends to the bottom of the first exhaust box 610. The second exhaust line 652 may exhaust the fume generated in another one (e.g., the second process chamber 322) of the plurality of second process chambers 321, 322, and 323. A plurality of exhaust holes 652a for providing a negative pressure are installed in the second exhaust line 652.

The third exhaust line 653 is disposed on a third side (e.g., the lower side) of the first exhaust box 610. One end of the third exhaust line 653 extends to the exhaust box 611 (i.e., a height corresponding to the second process chamber 321) located on the first floor, and the other end 653b of the third exhaust line 653 extends to the bottom of the first exhaust box 610. The third exhaust line 653 may exhaust the fume generated in the other one (e.g., 321) of the plurality of second process chambers 321, 322, and 323. A plurality of exhaust holes 653a for providing a negative pressure are installed in the third exhaust line 653.

The other end 651b of the first exhaust line 651, the other end 652b of the second exhaust line 652, and the other end 653b of the third exhaust line 653 may be connected to separate external exhaust lines under the first exhaust box 610 to exhaust the fume.

When the first exhaust line 651, the second exhaust line 652, and the third exhaust line 653 are used, the fume generated in the plurality of second process chambers 321, 322, and 323 may be prevented from leaking out of the apparatus for treating a substrate.

If there are no exhaust lines or if a cooling fan is simply used, the fume generated in the plurality of second process chambers 321, 322, and 323 may flow out of the apparatus for treating a substrate.

Figure 12:
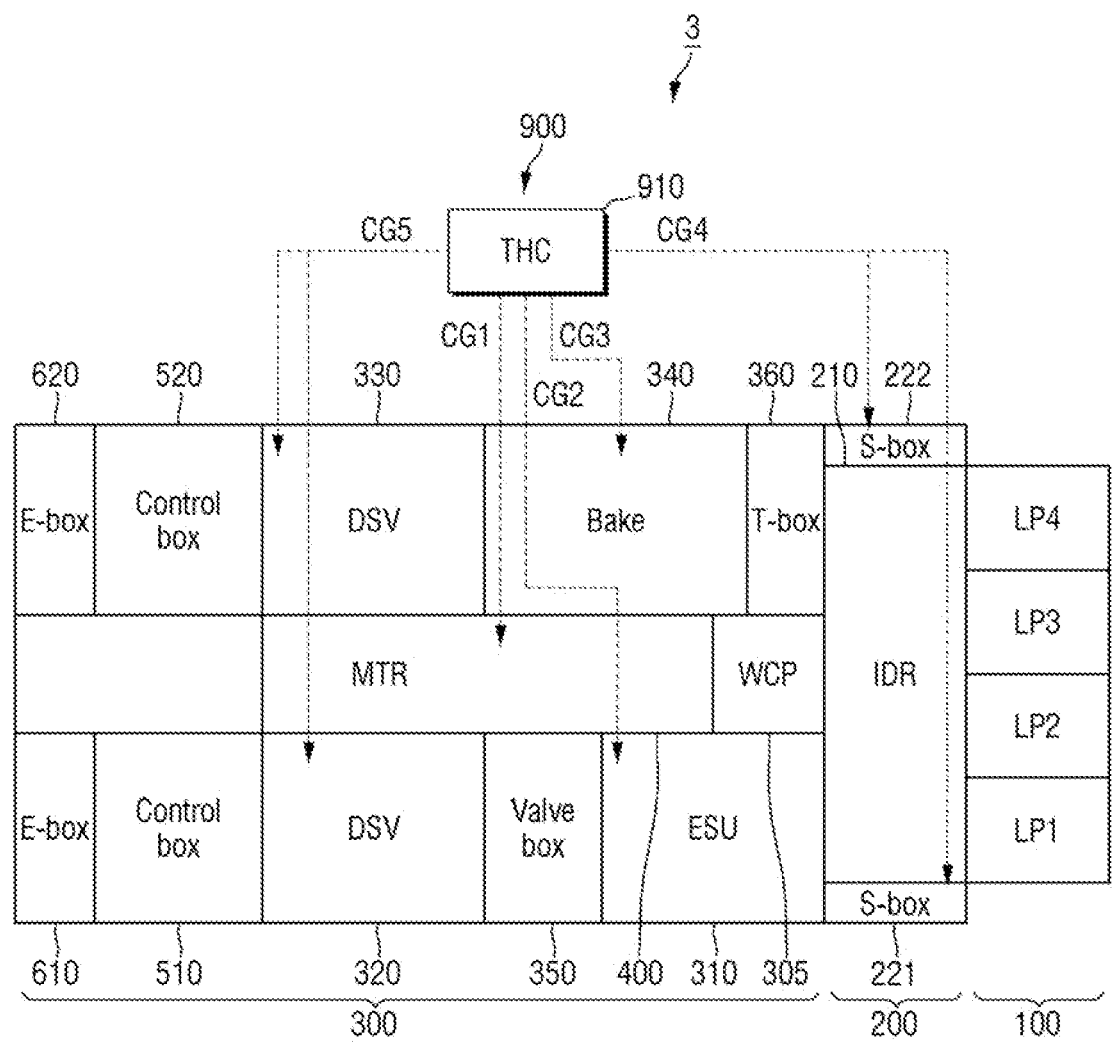
FIG. 12 is a conceptual diagram for explaining an apparatus for treating a substrate according to a third embodiment of the present disclosure.

FIG. 12 is a conceptual diagram for explaining an apparatus for treating a substrate according to a third embodiment of the present disclosure. For simplicity, the second embodiment will hereinafter be described, focusing mainly on differences with the embodiments of FIGS. 5 to 11.

Referring to FIG. 12, in an apparatus 3 for treating a substrate according to a third embodiment of the present disclosure, the temperature and humidity control system 900 supplies a gas CG5 of constant temperature and humidity to the second process chamber 320 and the third process chamber 330.

That is, the temperature and humidity control system 900 provides a gas CG1 of constant temperature and humidity to the transfer chamber 400, provides a gas CG2 of constant temperature and humidity to the first process chamber 310, provides a gas CG3 of constant temperature and humidity to the fourth process chamber 340, provides a gas CG4 of constant temperature and humidity to the index module 200, and provides a gas CG5 of constant temperature and humidity to the second process chamber 320 and the third process chamber 330.

As such, by supplying the gases CG1 to CG5 of constant temperature and humidity, the temperature and humidity of the substrate subjected to the exposure process are controlled by the gases CG1 to CG5 of constant temperature and humidity during the entire process (i.e., developing, dry, and baking process).

Figure 13:
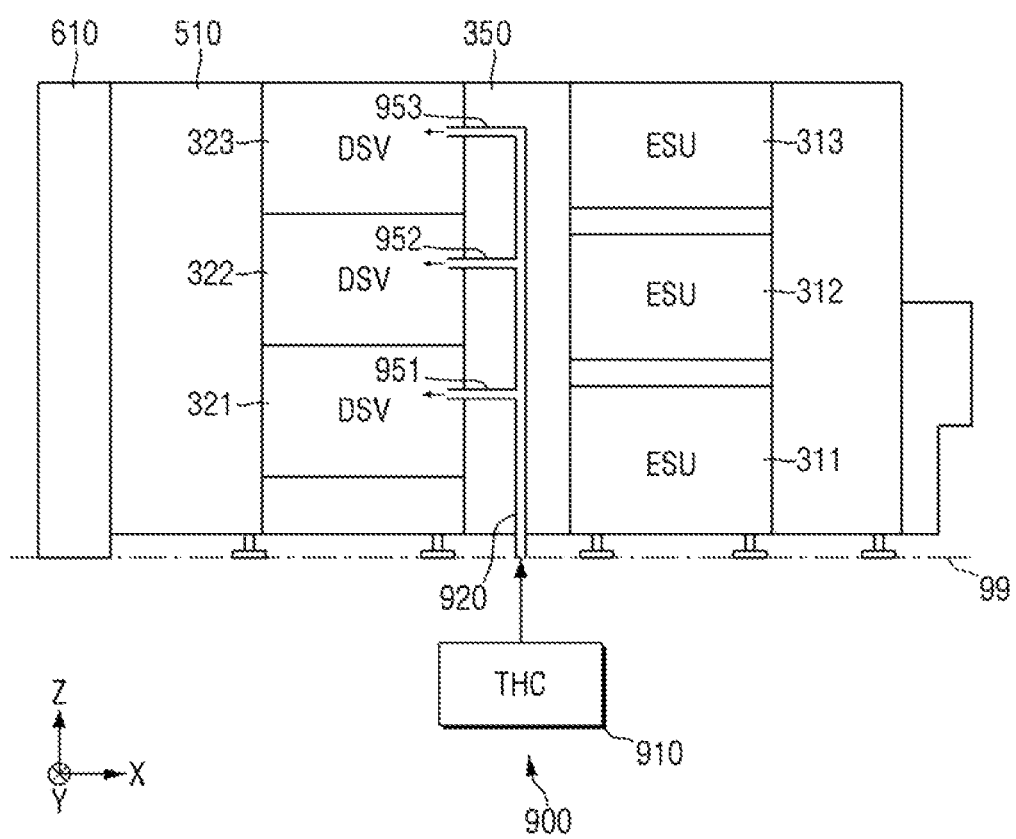
FIG. 13 is an example view illustrating supplying a gas of constant temperature and humidity to a second process chamber of the apparatus for treating a substrate of FIG. 12.

FIG. 13 is an example view illustrating supplying a gas of constant temperature and humidity to a second process chamber of the apparatus for treating a substrate of FIG. 12.

Referring to FIG. 13, a plurality of second process chambers 321, 322, and 323 may be provided, and the plurality of second process chambers 321, 322, and 323 may be stacked in the third direction Z. The valve box 350 may be elongated along the direction in which the plurality of second process chambers 321, 322, and 323 are stacked.

The gas providing unit 910 may be located lower than the valve box 350. For example, the gas providing unit 910 may be located below the bottom surface 99 of the manufacturing plant.

In this case, the supply pipe structure of the temperature and humidity control system 900 includes a main supply pipe 920, a sub-supply pipe 951, a sub-supply pipe 952, and a sub-supply pipe 953. The main supply pipe 920 passes through the valve box 350. The sub-supply pipe 951, the sub-supply pipe 952, and the sub-supply pipe 953 may be connected to the plurality of second process chambers 321, 322, and 323, respectively.

Figure 14:
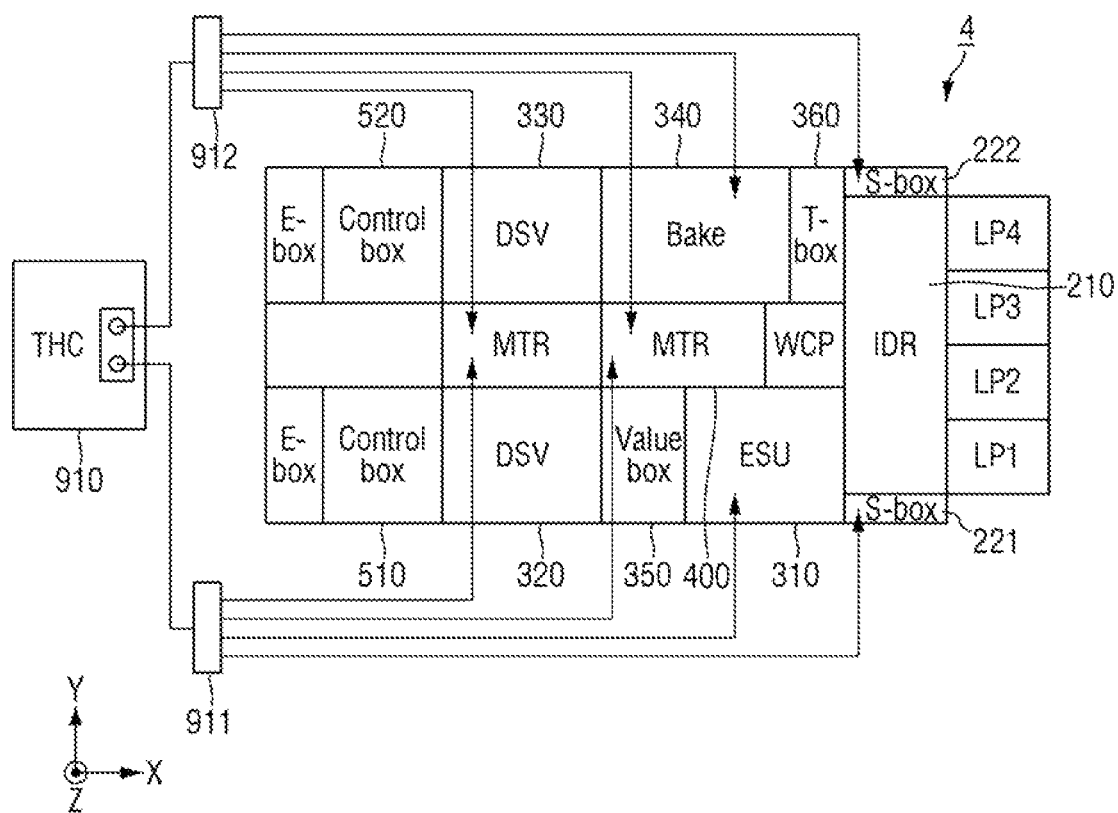
FIG. 14 is a conceptual diagram for explaining an apparatus for treating a substrate according to a fourth embodiment of the present disclosure.

FIG. 14 is a conceptual diagram for explaining an apparatus for treating a substrate according to a fourth embodiment of the present disclosure.

Referring to FIG. 14, in an apparatus 4 for treating a substrate according to a fourth embodiment of the present disclosure, the gas providing unit 910 is disposed spaced apart from the process module 300 (see, e.g., FIG. 5) and installed above the bottom surface of the manufacturing plant.

The gas providing unit 910 supplies a gas of constant temperature and humidity to the transfer chamber 400, the first process chamber 310, and the airflow supply box 221 (i.e., index chamber 210) through a plurality of pipes branched off from a first branch part 911. Such pipes may be disposed above the process module 300.

Also, the gas providing unit 910 supplies a gas of constant temperature and humidity to the transfer chamber 400, the fourth process chamber 340, and the airflow supply box 222 (i.e., index chamber 210) through a plurality of pipes branched off from a second branch part 912. Such pipes may be disposed above the process module 300.

The first branch part 911 and the second branch part 912 may be disposed above the process module 300.

As described above, since the transfer chamber 400 is elongated along the first axis X, each of the front part and the rear part of the transfer chamber 400 may be supplied with the gas of constant temperature and humidity through separate pipes.

Although not separately illustrated, the gas providing unit 910 may supply a gas of constant temperature and humidity to the second process chamber 320 and the third process chamber 330.

Figure 15:
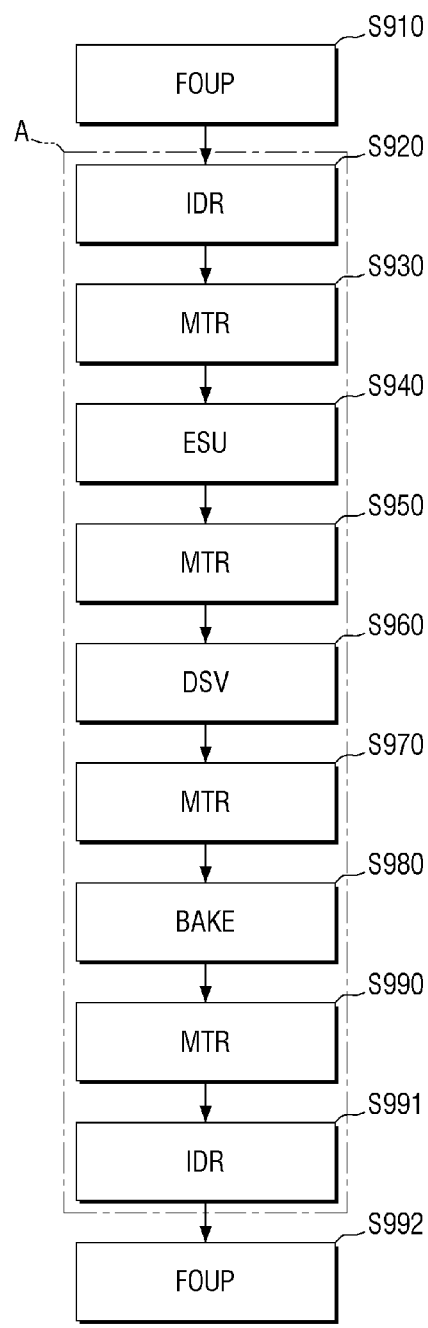
FIG. 15 is a flowchart for describing a method of treating a substrate according to some embodiments of the present disclosure.

FIG. 15 is a flowchart for describing a method of treating a substrate according to some embodiments of the present disclosure.

Referring to FIGS. 12 and 15, the container FOUP in which the substrate subjected to an exposure process is placed on the loading plate of the load port 100 in S910.

Then, the index robot of the index module 200 picks up the substrate and delivers the substrate to the buffer chamber 305 in 20.

Next, the transfer robot of the transfer chamber 400 picks up the substrate from the buffer chamber 305 and delivers the substrate to the first process chamber 310 in S930.

Then, the substrate is developed with a developer in the first process chamber 310 in S940.

Then, the transfer robot of the transfer chamber 400 delivers the substrate from the first process chamber 310 to the second process chamber 320 or the third process chamber 330 in S950. In particular, the developer supplied in the first process chamber 310 remains on the substrate and is transferred to the second process chamber 320 or the third process chamber 330.

Then, in the second process chamber 320 or the third process chamber 330, the substrate is dried by a supercritical fluid in S960.

Then, the transfer robot of the transfer chamber 400 delivers the dried substrate from the second process chamber 320 or the third process chamber 330 to the fourth process chamber 340 in S970.

Then, in the fourth process chamber 340, the substrate is baked in S980.

Thereafter, the transfer robot of the transfer chamber 400 delivers the baked substrate from the fourth process chamber 340 to the buffer chamber 305 in S990.

Then, the index robot of the index module 200 picks up the substrate and delivers the substrate into the container FOUP on the load port 100 in S991 and S992.

As described above, the temperature and humidity control system 900 supplies gases CG1 to CG5 of constant temperature and humidity to all the index module 200, the first process chamber 310, the second process chamber 320, the third process chamber 330, the fourth process chamber 340, and the transfer chamber 400. By supplying the gases CG1 to CG5 of constant temperature and humidity, the temperature and humidity of the substrate subjected to the exposure process are controlled by the gases CG1 to CG5 of constant temperature and humidity during the entire process (i.e., developing, dry, and baking process) of the apparatus 3 for treating a substrate.

While the embodiments of the present disclosure have been described with reference to the accompanying drawings, the present disclosure is not limited to the embodiments and may be embodied in various different forms, and those skilled in the art will appreciate that the present disclosure may be embodied in specific forms other than those set forth herein without departing from the technical ideas and characteristics of the present disclosure. The disclosed example embodiments are therefore to be construed in all aspects as illustrative and not restrictive.

What is claimed:

1. An apparatus for treating a substrate comprising:
 at least one first process chamber configured to supply a developer onto the substrate;
 at least one second process chamber configured to treat the substrate using a supercritical fluid;
 a transfer chamber configured to transfer the substrate from the at least one first process chamber to the at least one second process chamber, while the developer supplied in the at least one first process chamber remains on the substrate;
 a temperature and humidity control system configured to:
  manage temperature and humidity of the transfer chamber by supplying a first gas of constant temperature and humidity into the transfer chamber, or
  manage temperature and humidity of the at least one first process chamber by supplying a second gas of constant temperature and humidity into the at least one first process chamber; and
 a valve box,
 wherein the temperature and humidity control system comprises:
  a gas providing unit located lower than the valve box and configured to provide the first gas of the constant temperature and humidity or the second gas of the constant temperature and humidity; and
  at least one supply pipe connected to the gas providing unit and extending to the transfer chamber or the at least one first process chamber while passing through the valve box.

2. The apparatus of claim 1, wherein the temperature and humidity control system is configured to manage the temperature and humidity of the transfer chamber by supplying the first gas of the constant temperature and humidity from an upper surface of the transfer chamber so that a downflow is formed in the transfer chamber.

3. The apparatus of claim 2, wherein the valve box is between the at least one first process chamber and the at least one second process chamber,
 wherein the gas providing unit is configured to provide the first gas of the constant temperature and humidity; and
 wherein the at least one supply pipe comprises a gas supply pipe connected to the gas providing unit and extending to an upper portion of the transfer chamber while passing through the valve box.

4. The apparatus of claim 1, wherein the temperature and humidity control system is configured to manage temperature and humidity of the at least one first process chamber by supplying the second gas of constant temperature and humidity into the at least one first process chamber.

5. The apparatus of claim 4, wherein the at least one first process chamber is a plurality of first process chambers that are stacked,
 wherein the valve box is disposed on one side of the plurality of first process chambers,
 wherein the gas providing unit is configured to provide the second gas of the constant temperature and humidity; and
 wherein the at least one supply pipe comprises:
  a main supply pipe connected to the gas providing unit and extending such as to pass through the valve box; and
  a plurality of sub-supply pipes branched off from the main supply pipe and respectively connected to the plurality of first process chambers.

6. The apparatus of claim 1, further comprising:
 an exhaust box installed on one side of the at least one second process chamber, the exhaust box comprising at least one exhaust line that is configured to exhaust fume generated in the at least one second process chamber using a negative pressure.

7. The apparatus of claim 6, wherein the at least one second process chamber is a plurality of second process chambers that are stacked, and the at least one exhaust line is elongated along a direction in which the plurality of second process chambers are stacked.

8. An apparatus for treating a substrate comprising:
 at least one first process chamber configured to supply a developer onto the substrate;
 at least one second process chamber configured to treat the substrate using a supercritical fluid;
 a transfer chamber configured to transfer the substrate from the at least one first process chamber to the at least one second process chamber, while the developer supplied in the at least one first process chamber remains on the substrate; and
 a temperature and humidity control system configured to manage temperature and humidity of the transfer chamber by supplying a first gas of constant temperature and humidity into the transfer chamber,
 an exhaust box installed on one side of the at least one second process chamber, the exhaust box comprising at least one exhaust line that is configured to exhaust fume generated in the at least one second process chamber using a negative pressure,
 wherein the at least one second process chamber is a plurality of second process chambers that are stacked, and the at least one exhaust line is elongated along a direction in which the plurality of second process chambers are stacked,
 wherein the at least one exhaust line is a plurality of exhaust lines,
 wherein a first exhaust line among the plurality of exhaust lines is disposed on a first side of the exhaust box and configured to exhaust fume generated in at least one from among the plurality of second process chambers, and
 wherein a second exhaust line among the plurality of exhaust lines is disposed on a second side of the exhaust box and configured to exhaust fume generated in at least another one from among the plurality of second process chambers.

9. The apparatus of claim 1, further comprising an index module configured to receive the substrate from an outside and provide the substrate to a buffer chamber,
 wherein the temperature and humidity control system is configured to manage temperature and humidity of the index module by supplying a second third gas of constant temperature and humidity into the index module.

10. The An apparatus for treating a substrate comprising:
 at least one first process chamber configured to supply a developer onto the substrate;
 at least one second process chamber configured to treat the substrate using a supercritical fluid;
 a transfer chamber configured to transfer the substrate from the at least one first process chamber to the at least one second process chamber, while the developer supplied in the at least one first process chamber remains on the substrate;
a temperature and humidity control system configured to manage temperature and humidity of the transfer chamber by supplying a first gas of constant temperature and humidity into the transfer chamber; and
a third process chamber that is configured to bake the substrate, after the substrate is treated in the at least one second process chamber,
wherein the temperature and humidity control system is configured to manage temperature and humidity of the third process chamber by supplying a second gas of constant temperature and humidity into the third process chamber.

11. An apparatus for treating a substrate subjected to an exposure process, the apparatus comprising:
an index module configured to receive the substrate subjected to the exposure process;
process modules for treating the substrate, the process modules comprising:
at least one first process chamber configured to supply a developer onto the substrate,
at least one second process chamber configured to dry the substrate, which has been treated in the at least one first process chamber, by using a first supercritical fluid,
a third process chamber disposed to face at least a part of the at least one second process chamber and configured to dry the substrate, which has been treated in the at least one first process chamber, by using a second supercritical fluid,
a fourth process chamber disposed to face at least a part of the at least one first process chamber and configured to bake the substrate which has been treated in the at least one second process chamber and the third process chamber, and
a process module comprising a transfer chamber disposed between the at least one first process chamber and the fourth process chamber and between the at least one second process chamber and the third process chamber, and
a temperature and humidity control system configured to manage temperature and humidity of the transfer chamber by supplying a first gas of constant temperature and humidity into the transfer chamber.

12. The apparatus of claim 11, wherein the temperature and humidity control system is configured to supply the first gas of the constant temperature and humidity from an upper surface of the transfer chamber so that a downflow is formed in the transfer chamber.

13. The apparatus of claim 11, wherein the temperature and humidity control system is configured to supply gases of constant temperature and humidity to the at least one first process chamber, the fourth process chamber, and the index module, respectively.

14. The apparatus of claim 13, wherein the temperature and humidity control system is further configured to supply gases of constant temperature and humidity to the at least one second process chamber and the third process chamber, respectively.

15. The apparatus of claim 11, further comprising a valve box disposed between the at least one first process chamber and the at least one second process chamber,
wherein the temperature and humidity control system comprises a gas providing unit located lower than the valve box, the gas providing unit configured to provide the first gas of the constant temperature and humidity.

16. The apparatus of claim 15, wherein the temperature and humidity control system further comprises:
a main supply pipe connected to the gas providing unit and disposed to pass through the valve box; and
a first sub-supply pipe and a second sub-supply pipe that are branched off from the main supply pipe,
wherein the first sub-supply pipe is configured to supply the first gas of the constant temperature and humidity to a front half of the transfer chamber and the second sub-supply pipe is configured to supply the first gas of the constant temperature and humidity to a rear half of the transfer chamber.

17. The apparatus of claim 15, wherein the at least one first process chamber is a plurality of first process chambers that are stacked, and
the temperature and humidity control system comprises:
a main supply pipe connected to the gas providing unit and extending to pass through the valve box, and
a plurality of sub-supply pipes branched off from the main supply pipe and respectively connected to the plurality of first process chambers.

18. The apparatus of claim 11, further comprising:
an exhaust box installed on one side of the at least one second process chamber, the exhaust box comprising at least one exhaust line configured to exhaust fume generated in the at least one second process chamber using a negative pressure.

19. The apparatus of claim 18, wherein the at least one second process chamber is a plurality of second process chambers that are stacked,
the at least one exhaust line is a plurality of exhaust lines,
a first exhaust line among the plurality of exhaust lines is disposed on a first side of the exhaust box and configured to exhaust fume generated in at least one from among the plurality of second process chambers, and
a second exhaust line among the plurality of exhaust lines is disposed on a second side of the exhaust box and configured to exhaust fume generated in at least another one from among the plurality of second process chambers.

* * * * *